(12) United States Patent
Crowder

(10) Patent No.: US 6,767,804 B2
(45) Date of Patent: Jul. 27, 2004

(54) 2N MASK DESIGN AND METHOD OF SEQUENTIAL LATERAL SOLIDIFICATION

(75) Inventor: Mark Albert Crowder, Portland, OR (US)

(73) Assignee: Sharp Laboratories of America, Inc., Camas, WA (US)

( * ) Notice: Subject to any disclaimer, the term of this patent is extended or adjusted under 35 U.S.C. 154(b) by 202 days.

(21) Appl. No.: 10/008,881

(22) Filed: Nov. 8, 2001

(65) Prior Publication Data

US 2003/0088848 A1 May 8, 2003

(51) Int. Cl.$^7$ ...................... H01L 21/00; H01L 21/337; H01L 21/336; H01L 21/331; H01L 21/20

(52) U.S. Cl. ...................... 438/487; 438/150; 438/151; 438/166; 438/168; 438/187; 438/198; 438/308; 438/378; 438/482; 438/487; 438/488; 438/942

(58) Field of Search ................................ 438/150, 151, 438/166, 168, 187, 198, 308, 378, 482, 487, 488, 942

(56) References Cited

U.S. PATENT DOCUMENTS

| | | | | |
|---|---|---|---|---|
| 6,117,752 A | * | 9/2000 | Suzuki ........................ | 438/487 |
| 6,177,301 B1 | | 1/2001 | Jung .......................... | 438/150 |
| 6,235,614 B1 | | 5/2001 | Yang .......................... | 438/486 |
| 6,274,888 B1 | | 8/2001 | Suzuki et al. ................. | 257/72 |
| 6,326,286 B1 | * | 12/2001 | Park et al. ................... | 438/478 |

OTHER PUBLICATIONS

Article entitled, "Phase Transformation Mechanisms involved in Excimer Laser crystallization of Amorphous Silicon Films", by Im et al., published in Appl. Phys. Lett. 63 (14), Oct. 4, 1993, pp 1969–1971.

Article entitled, "Sequential Lateral Solidification of Thin Silicon Films on SiO$_2$", by Sposili et al., published in Appl. Phys. Lett. 69 (19) Nov. 4, 1996, pp 2864–2866.

Article entitled, "Controlled Super–Lateral Growth of Si Films for Microstructural Manipulation and Optimization", by Im et al., published in Phys. Stat. Sol. (a) 166, 603 (1998), pp 603–617.

Article entitled, "Crystalline Si Films for Integrated Active–Matrix Liquid–Crystal Displays", by Im et al., published in MRS Bulletin/Mar. 1996, pp 39–48.

Article entitled, "Low–Temperature Single–Crystal Si TFT's Fabricated on Si Films Processed via Sequential Lateral Solidification", by Crowder et al., published in IEEE Electron Device Letters, vol. 19, No. 8, Aug. 1998, pp 306–308.

Article entitled, "Single–Crystal Si Films for Thin–Film Transistor Devices", by Im et al., published in Appl. Phys. Lett. 70 (25), Jun. 23, 1997, pp 34343436.

\* cited by examiner

*Primary Examiner*—John F. Niebling
*Assistant Examiner*—Stanetta Isaac
(74) *Attorney, Agent, or Firm*—Matthew D. Rabdau; David C. Ripma

(57) ABSTRACT

A pan/tilt camera system includes a sensor spaced from a rotational shaft of a pan/tilt camera, a detected piece rotated with the rotational shaft so as to correspond to the sensor, an origin setting unit rotating the rotational shaft in a first direction upon turn-on of a power and thereafter in a second direction opposite to the first direction so that the sensor detects a rear end of the detected piece for setting an origin, a pulse counter applying a predetermined number of pulses to the motor after set of the origin so that the rotational shaft is continuously rotated in the second direction and counting pulses applied to the motor until a front end of the detected piece with respect to the rotation direction of the detected piece is detected, and a backlash calculating unit comparing a count of the pulse counter with the predetermined number of pulses applied to the motor thereby to calculate an amount of backlash of the drive mechanism.

8 Claims, 8 Drawing Sheets

2N MASK DESIGN AND METHOD OF SEQUENTIAL LATERAL SOLIDIFICATION

BACKGROUND OF THE INVENTION

The present invention relates to sequential lateral solidification(SLS).

One method of SLS, which may be referred to as the "2-shot process," has been investigated for use in high-throughput processes. In this process, small beamlets, or a small beamlet, are projected onto regions of a silicon film overlying another substrate to induce melting and solidification(also referred to as "crystallization") of large-grained polycrystalline silicon material. This may be referred to as a first shot. The small beamlets are then advanced and the process repeated such that the melted and solidified regions of this second shot overlap the regions of the first shot.

This process may be accomplished by using a single array of beamlets and making two or more passes over a given region of silicon film and microtranslating the array between passes. The process may also be accomplished by using multiple arrays of beamlets that are staggered with respect to each other and scanning the entire pattern in a across the silicon film. A single beamlet may also be used to iteratively stitch together crystallized regions, although this offers poor throughput.

The material produced using the above described process has severe directionality effects. The material has a plurality of narrow rectangular crystal grains oriented with the long axis perpendicular to the beamlet length.

As these directional effects are generally undesirable, a 2+2 process may be used to reduce, or eliminate, these directional effects. This may be accomplished by following up a first 2-shot process with a second 2-shot process carried out in a direction orthogonal to the first. This has been carried out by crystallizing silicon with an initial 2-shot process, rotating the sample being crystallized by 90 degrees, and then carrying out the second 2-shot process.

The need to rotate the sample by 90 degrees decreases throughput of the system, and adds complexity to the stage system for carrying out the SLS process.

SUMMARY OF THE INVENTION

Accordingly, a mask design is provided which enables a 2+2 process to be accomplished without the need to rotate the mask or the substrate relative to each other. This reduces the complexity of stages or mask mounts, and improves the angular alignment of the multiple 2-shot processes. The mask comprises a first set of two arrays of beamlets oriented substantially parallel to each other, and a second set two arrays of beamlets oriented at an angle, for example 90 degrees, relative the first set of two arrays.

The first set of two arrays is arranged so that a second array of beamlets is offset relative to a first array of beamlets, such that when the mask is transitioned the second array of beamlets will fill the gap between the first array of beamlets and slightly overlap the first array of beamlets.

A method of using the mask to accomplish a 2N processing is also provided.

DETAILED DESCRIPTION OF THE INVENTION

Figure 1:
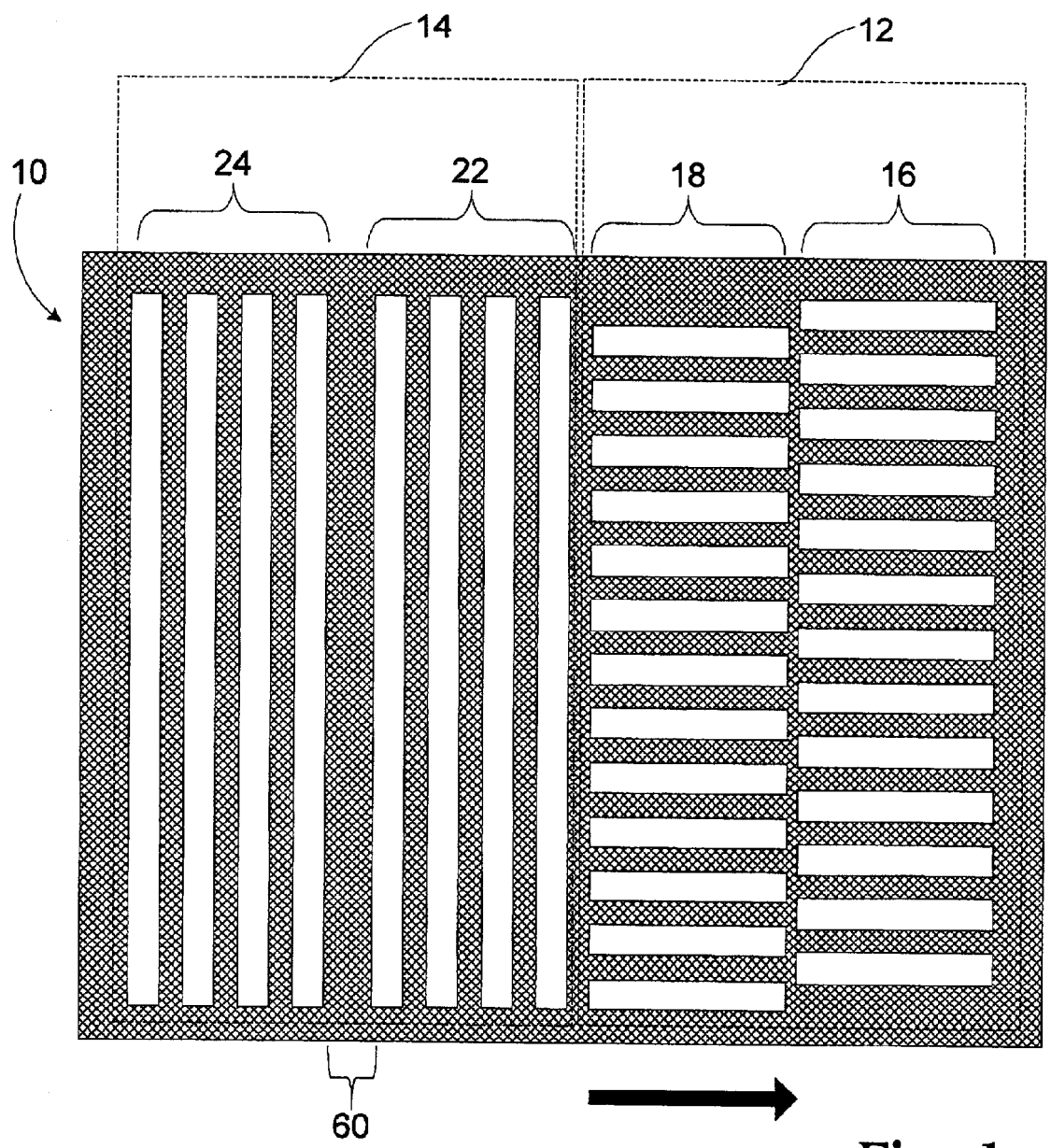
FIG. 1 is a view of a 2+2 mask design.

FIG. 1 is one embodiment of a mask 10 for a 2+2 shot process, which eliminates the need to rotate the substrate ninety degrees relative to the mask. Systems that rotate the substrate ninety degrees relative to the mask require complicated stage or mask retaining systems. Also it is difficult to achieve a precise ninety degree rotation, to the tolerance desired to produce optimal crystal structures. The precision of modern mask design allows the mask 10 to produce sets of beamlets which are much more precisely ninety degrees relative to another set of beamlets. This allows the mask design 10 to produce crystals that have more precisely orthogonal structures.

The mask 10 comprises a first set of slits 12 and a second set of slits 14, which are at a desired angle relative to the first set of slits. In one embodiment, the desired angle may be ninety degrees. The first set of slits consist of two arrays of beamlets, a first array of beamlets 16 and a second array of beamlets 18. The first array of beamlets 16 and the second array of beamlets 18 are preferably arranged adjacent to each other, substantially parallel to each other, and offset relative to each other with a slight overlap. The two arrays of beamlets that comprise the first set of slits 12 may be used in a first 2-shot process. For illustration, a laser source (not shown) is projected through the first array of beamlets 16 to crystallize a layer of material (not shown). The mask 10 is then stepped in the direction indicated by the arrow in FIG. 1. The second array of beamlets 18 is then used to crystallize the layer of material. The crystallized region formed by the first array of beamlets 16, and the crystallized region formed by the second array of beamlets 18 may intersect to form a continuous crystallized region. The intersection of the crystallized regions may be accomplished by having a slight overlap of the crystallized regions for the first array of beamlets and the second array of beamlets.

As the mask 10 is moved again in the direction indicated by the arrow, the second set of slits will be projected, at least partially, over regions of material which have previously been crystallized by the first set of slits. The second set of slits comprises a third array of beamlets 22 and a fourth array of beamlets 24. The third array of beamlets 22 and the fourth array of beamlets 24 are preferably parallel to each other. After the third array of beamlets 22 has been used to crystallize portions of a region of material, the mask 10 is moved again. The forth array of beamlets 24 then slightly overlaps the regions crystallized by the third array of beamlets and crystallizes this region. The second set of slits effectively produces a second 2-shot process. Accordingly, the mask 10 shown in FIG. 1 accomplishes a 2+2 process without rotating the stage relative to the mask. As shown, the first set of slits is oriented horizontally and the second set of slits is oriented vertically. It is also entirely possible, to have the first set of slits oriented vertically and the second set of slits oriented horizontally.

Figure 2:
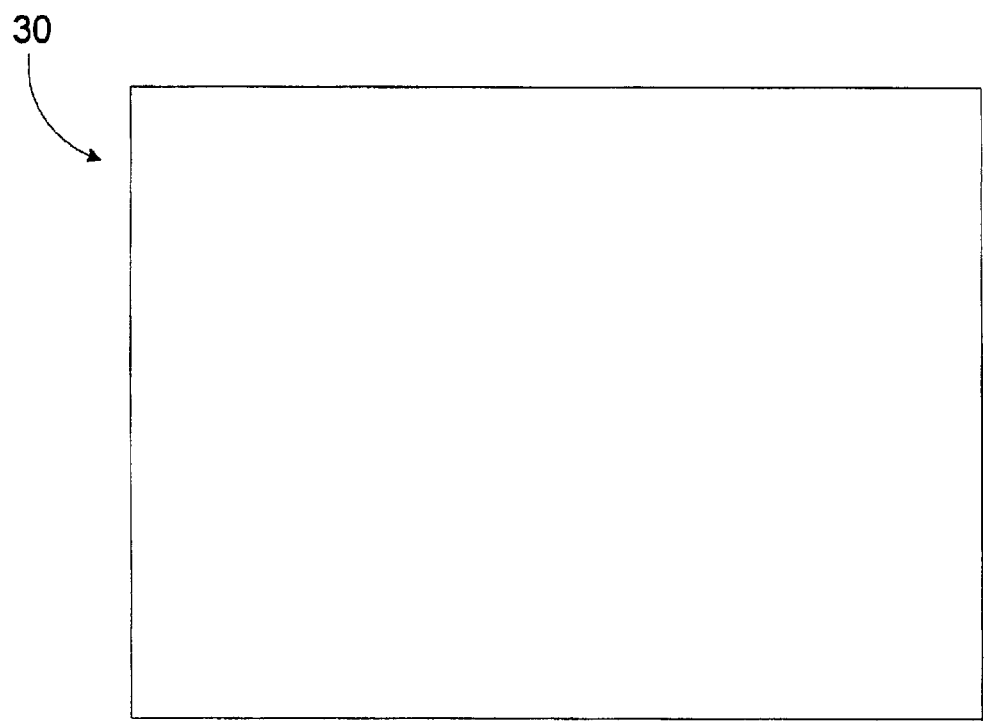
FIG. 2 shows a region of material prior to SLS processing.

FIG. 2 shows a region of material 30 that has been deposited over a substrate. The material is preferably amorphous material although it may contain microcrystals or be polycrystalline. The material is preferably silicon, germanium, copper, silicon germanium, or aluminum.

Figure 3:
FIG. 3 shows the region of material during a first irradiation exposure.

FIG. 3 illustrates irradiation of regions exposed by the first array of beamlets 16. The irradiation is provided by a suitable irradiation source, including an electron beam, ion beam or laser irradiation. If laser irradiation is used the source may be a uv laser, such as an excimer laser. An excimer laser may be used at 308 nm for example. The region of material under the beamlets crystallizes by melting and solidifying. The region preferably crystallizes from the edges of the beamlets inward toward the center of the beamlets.

Figure 4:
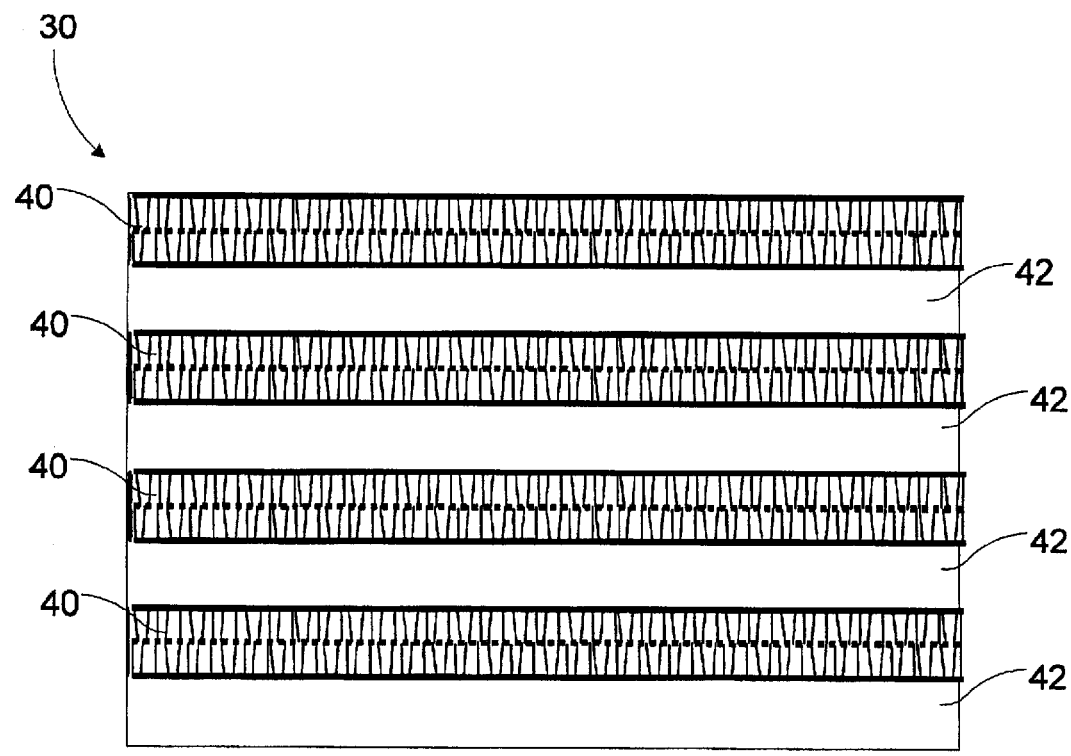
FIG. 4 shows the region of material following the first irradiation exposure and crystallization.

FIG. 4 shows regions 40 crystallized by the first shot. The adjacent regions 42 remain in essentially their as deposited condition, which may be amorphous. After the regions 40 have been crystallized the mask 10 is advanced.

Figure 5:
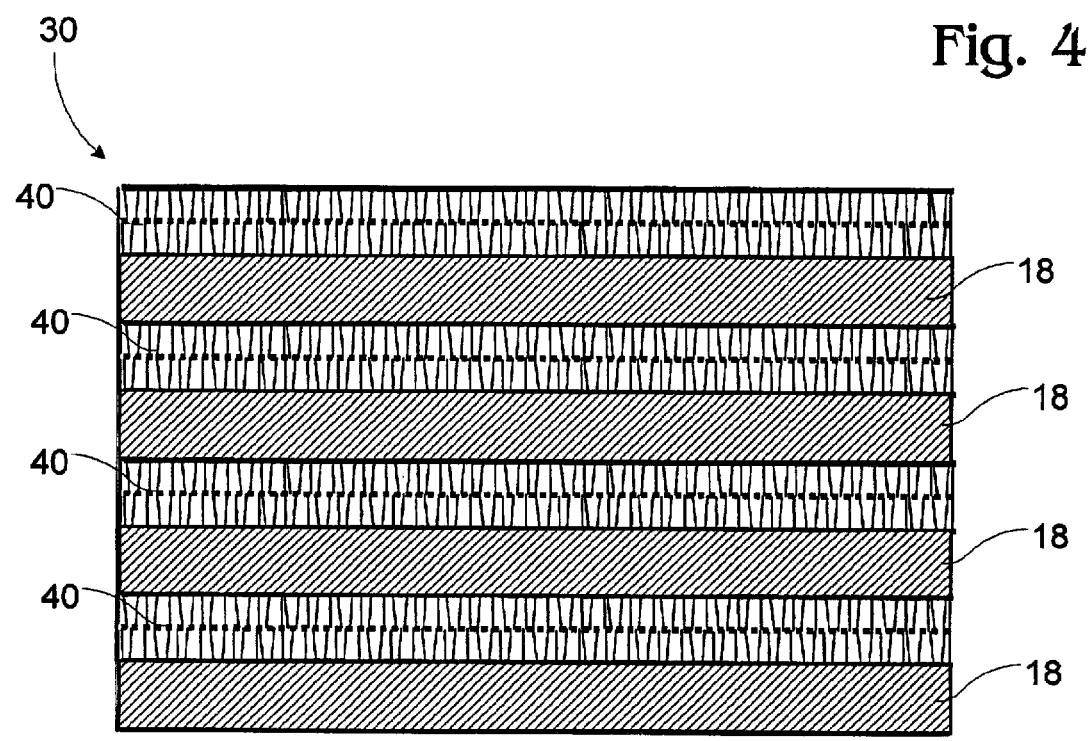
FIG. 5 shows the region of material during a second irradiation exposure.

FIG. 5 illustrates irradiation of regions exposed by the second array of beamlets 18. The second array of beamlets 18 preferably irradiate the adjacent regions 42 with a slight overlap into the previously crystallized regions 40. The adjacent regions 42 are then crystallized. This corresponds to the second shot in a two shot process. Although a 2-shot process is shown, it is also possible to use additional shots to crystallize the material in smaller segments. For example, a three shot process could be used.

Figure 6:
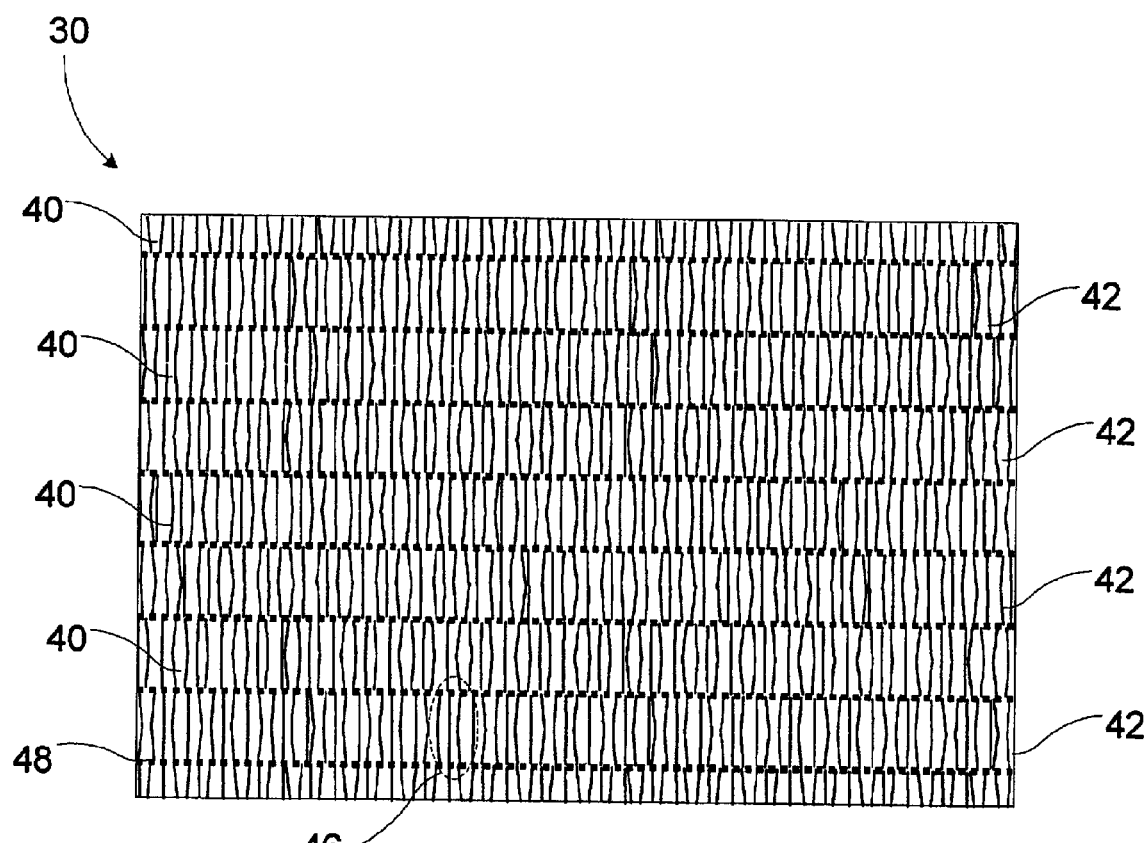
FIG. 6 shows the region of material following the second irradiation exposure and crystallization.

FIG. 6 shows regions 42 crystallized by the second shot, along with regions 40 which were crystallized by the first shot. The resulting crystallized material is characterized by directional effects of crystallization illustrated by the grain boundaries 46, along with high angle crystal boundaries 48 at the centerline of each beamlet, as denoted by the dotted line.

Figure 7:
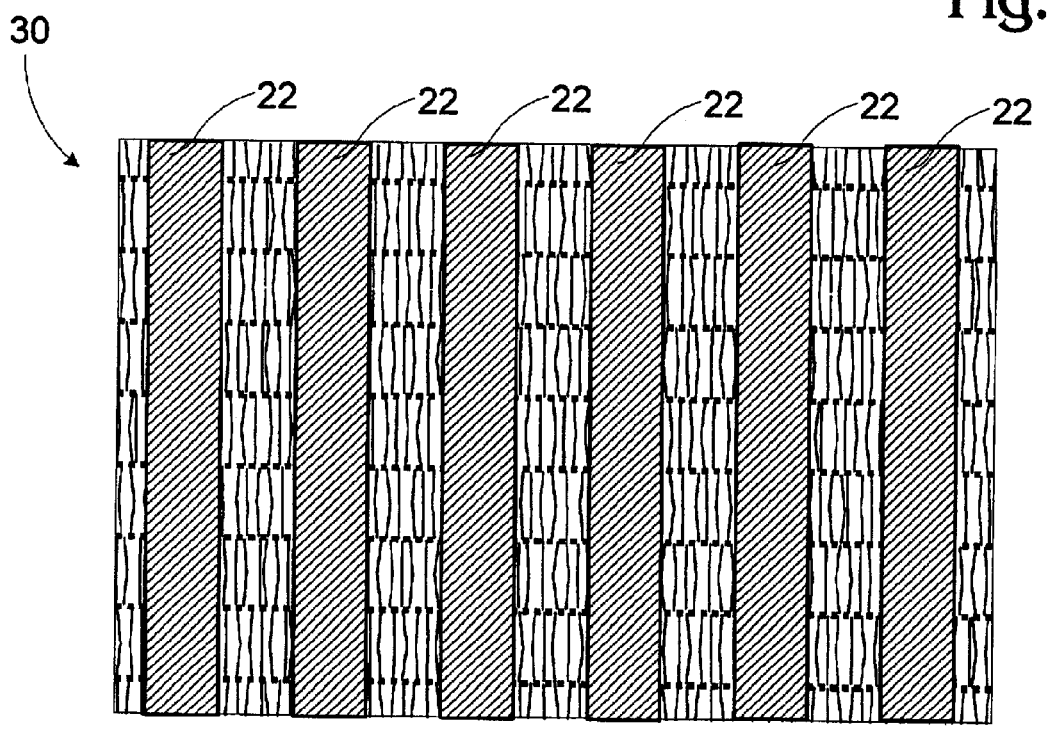
FIG. 7 shows the region of material during a third irradiation exposure.

To reduce the directional effects in the crystallized material. The material may be recrystallized at a different angle. This is accomplished by advancing the mask 10, and irradiating the crystallized material with the third array of beamlets 22. The third array of beamlets is oriented at an angle relative to the first array of beamlets and the second array of beamlets 18. The angle is preferably 90 degrees, as shown in FIG. 7.

Figure 8:
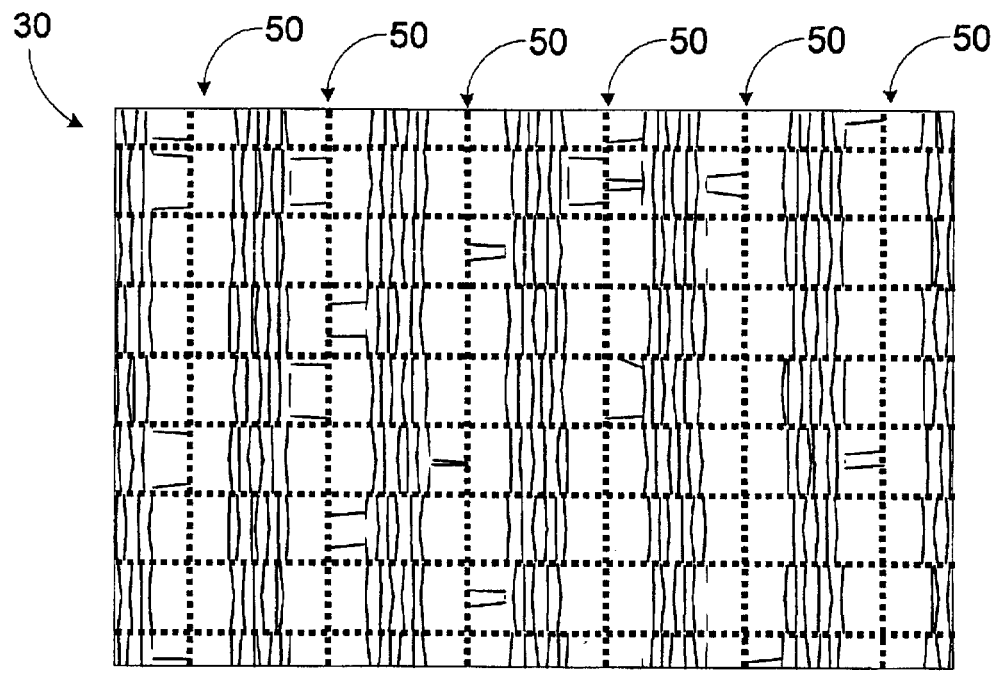
FIG. 8 shows the region of material following the third irradiation exposure and crystallization.

FIG. 8 shows regions 50 following crystallization. It should be noted that the directional effects in regions 50 have been reduced. Those in the adjacent regions 52 still show the directional effects of the previous crystallization process, also referred to as the first 2-shot process. The mask 10 is then advanced again.

Figure 9:
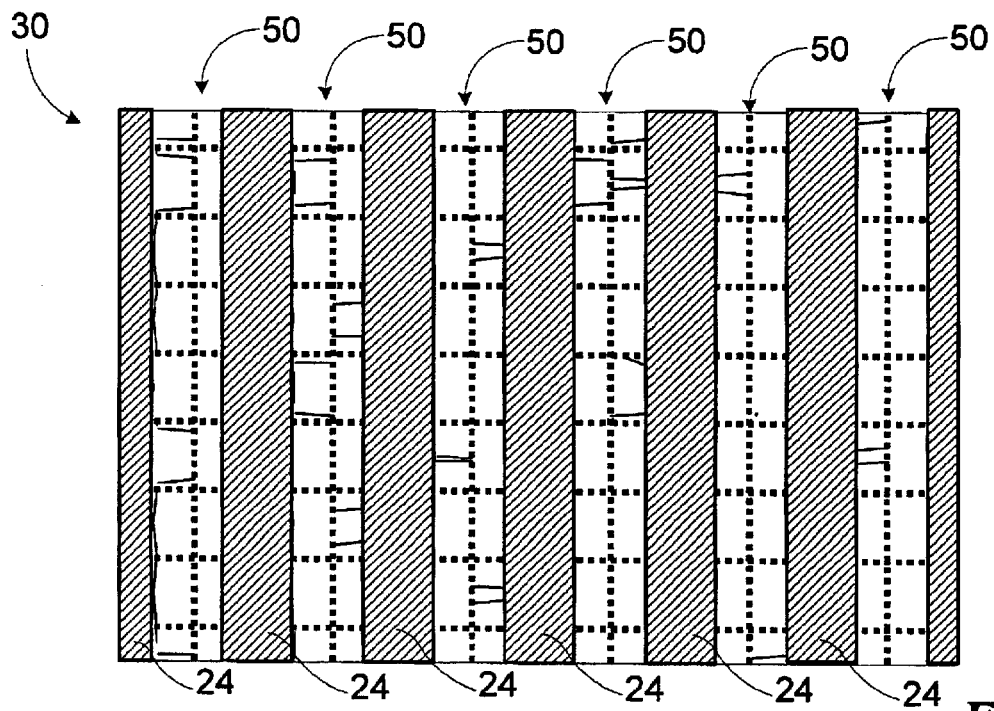
FIG. 9 shows the region of material during a forth irradiation exposure.

FIG. 9 illustrates the forth array of beamlets 24 irradiating the adjacent regions 52 with a slight overlap into the regions 50 which were crystallized using the third array of beamlets 22.

Figure 10:
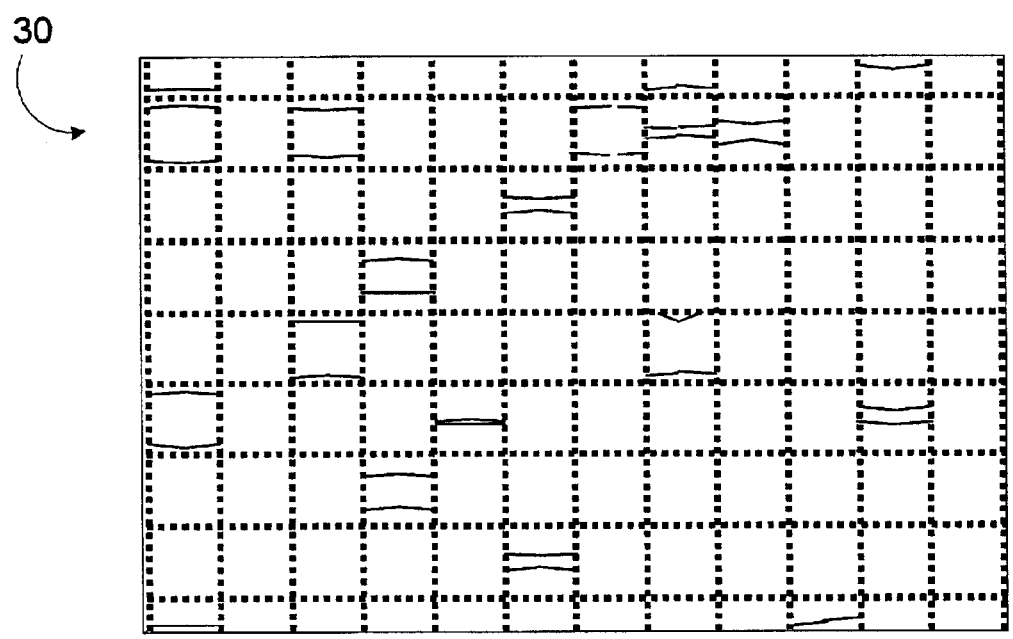
FIG. 10 shows the region of material following the forth irradiation exposure and crystallization.

FIG. 10 shows the material following irradition using the forth array of beamlets 24. Irradiation with the third array of beamlets 22 and the forth array of beamlets 24 corresponds to a second two shot process. The mask 10 has enabled the completion of a 2+2 process without the need to rotate the mask and stage relative to each other. Although, some directional effects remain, the directional effects have been significantly reduced.

The use of the mask 10 has allowed a 2+2 process to be completed without the need to rotate the mask relative to the material. This improves throughput, reduces the complexity of the stage or mask system; and provides greater precision in the angular alignment of the masks with respect to each other.

Figure 11:
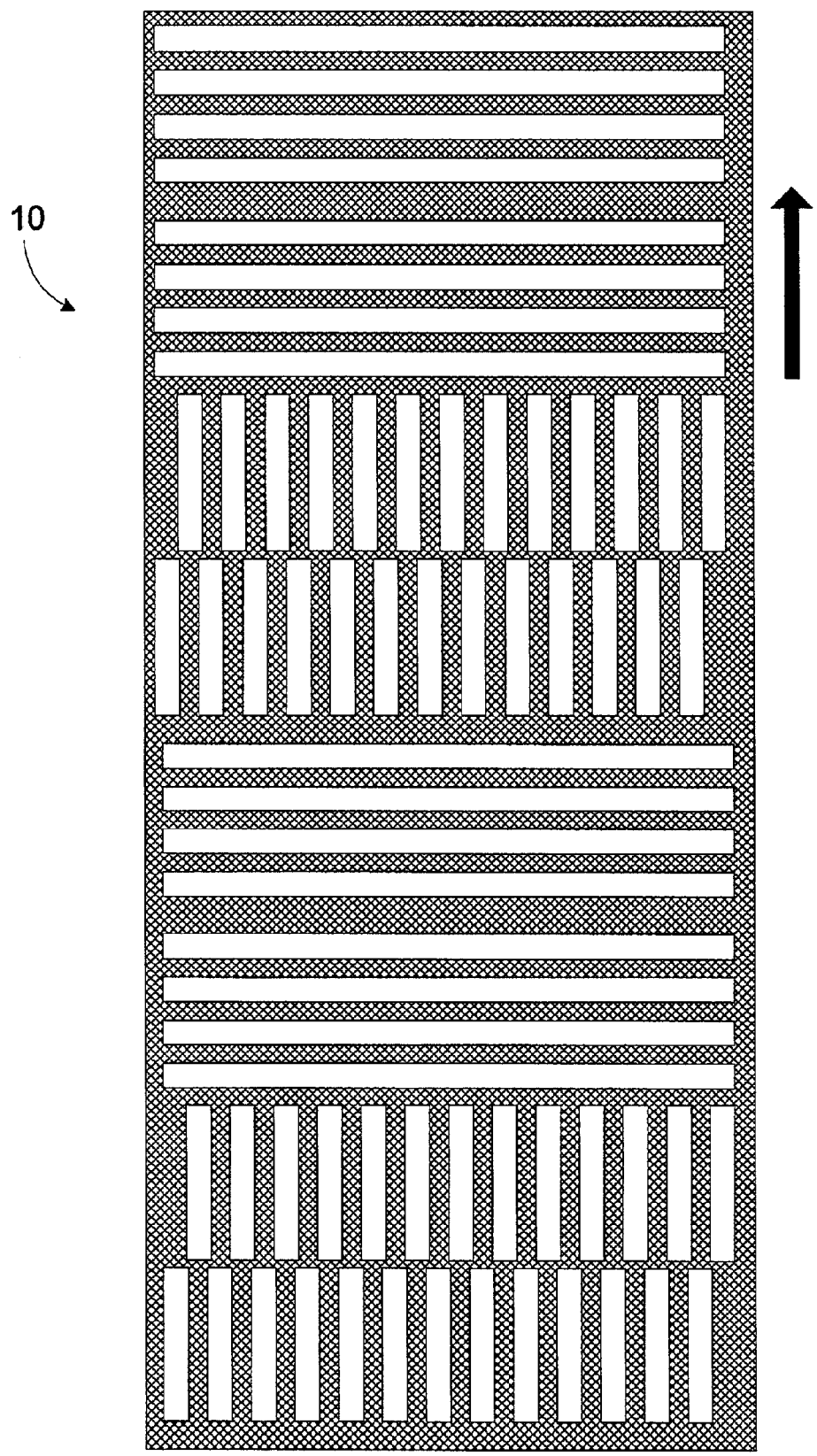
FIG. 11 is a view of a 2+2+2+2 mask design.

The mask 10 can be expanded to allow for further processing such as a 2+2+2 process, or 2+2+2+2 process, etc. FIG. 11 shows the mask 10 for use in a 2+2+2+2 process. Additional 2-shot processes, may further reduce directional effects and improve the overall crystal characteristics of the crystallized material. Multiple 2-shot processes can be referred to as a 2N process, where N is the number of 2-shot processes. For the mask shown in FIG. 11, N equals 4. There may eventually be a point of diminishing returns at which point no measurable improvement in material is reached for additional crystallization shots. Provided that the irradiation source has the ability to provide sufficient power to fully utilize the entire mask, throughput may not be adversely affected by adding additional 2-shot processes.

Figure 12:
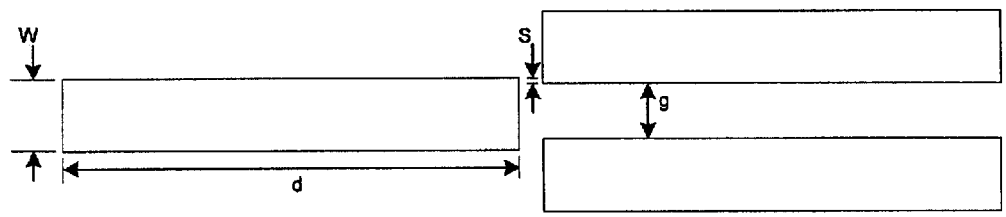
FIG. 12 is a view of a portion of a mask design.

Referring now to FIG. 12, which shows a view of adjacent beamlets taken from the first and second array of beamlets. Each beamlet has a width (W), a gap (g) and an overlap (S). The gap (g) is between adjacent elements is preferably designed to be the width (W) minus two times the overlap (S). The breadth (d) of the beamlets in the first and second arrays of beamlets should be greater than the step size between irradiation pulses. Although, there is no required upper limit on the breadth, the breadth is preferably only slightly greater than the step sizes between irradiation pulses to minimize the amount of overlap from one irradiation pulse to the next.

Referring again to FIG. 1, in this illustrated embodiment, the size of the steps between irradiation pulses is constrained by the distance across of the third array of beamlets 22 and the distance across the forth array of beamlets 24, which preferably have the same number of elements. In a preferred example, the step size would correspond to the number of elements in the array times the combination of the width of each element (W) and the gap (g) between adjacent beamlets. There is a gap 60 between the third array of beamlets 22 and the forth array of beamlets 24. The distance across this gap is preferably the sum of the width (W), plus the gap (g), minus the overlap (S), which reduces to 2W−3S, since the gap (g) is related to W and S as described above. The space between the first array of beamlets 16 and the second array of beamlets 18 is not critical. The space between the third array of beamlets 22 and the second array of beamlets 18 is also not critical.

For purposes of illustration, the width (W) may be on the order of between approximately 3 and 5 micrometers. The overlap (S) may be on the order of between approximately 0.25 and 1 micrometer.

Referring again to FIG. 11, the mask design can be extended for use in connection with any arbitrary number of 2-shot scans, such as 2+2+2, 2+2+2+2, etc. FIG. 11 shows one possible embodiment of a 2+2+2+2 mask design. Based upon the relationships described above one of ordinary skill in the art will be able to determine the necessary spacing of elements.

Figure 13:
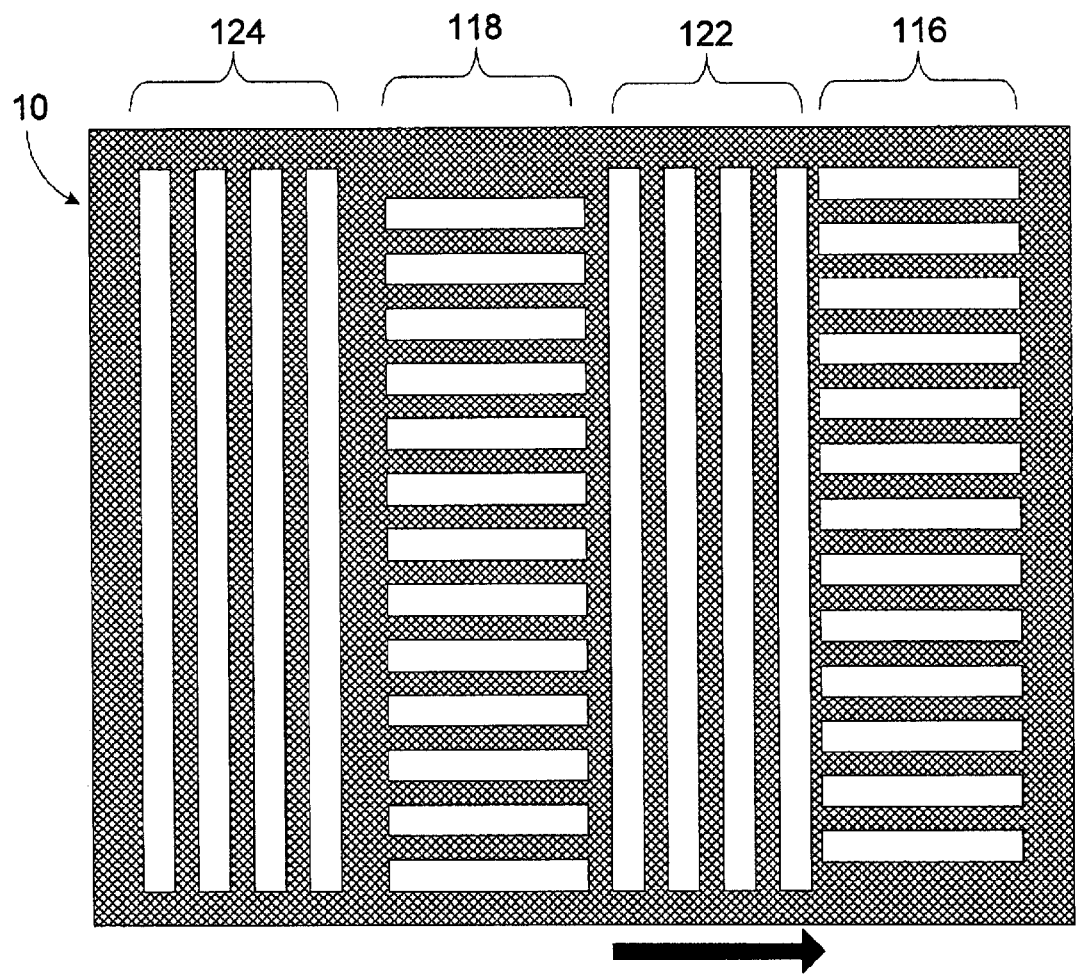
FIG. 13 is a view of one alternative 2+2 mask design.

Referring now to FIG. 13, in alternative embodiment the first array of beamlets 116 and the third array of beamlets 118 are designed to overlap slightly to crystallize material in one direction. While, the second array of beamlets 122 and the forth array of beamlets 124 irradiate at a second angle, preferably 90 degrees, relative to the first and third array of beamlets. Preferably the spacing will be optimized so that with the proper stopping distance the second array of beamlets 122 and the forth array of beamlets 124 will slightly overlap. This is just one exemplary embodiment to illustrate that the present invention is not limited to a single disclosed embodiment.

Rather, the scope of the invention will be determined by the broadest allowable interpretation of the following claims.

What is claimed is:

1. A method of crystallizing a thin film of material comprising the steps of:
   a) depositing a thin film of material over a substrate;
   b) irradiating regions of the material with a first array of beamlets by positioning a mask comprising the pattern of the first array of beamlets over the regions;
   c) stepping the mask until a second array of beamlets is positioned at least partially overlapping the regions irradiate by the first array of beamlets;
   d) irradiating regions adjacent to the regions irradiated by the first array of beamlets;
   e) stepping the mask until a third array of beamlets is positioned at least partially overlapping the regions irradiated by the first array of beamlets and the second array of beamlets;
   f) irradiating regions of the material with the third array of beamlets;
   g) stepping the mask until a forth array of beamlets is positioned at least partially overlap regions of the material irradiated by the third array of beamlets; and
   h) irradiating regions adjacent to the regions irradiated by the third array of beamlets.

2. The method of claim 1, wherein the mask is not rotated relative to the material during processing.

3. A method of performing a 2+2 process on a material layer deposited over a substrate comprising the steps of:
   a) providing a mask comprising a first set of substantially parallel slits and a second set of substantially parallel slits at an angle relative to the first set of slits;
   b) performing a first 2-shot process using the first set of slits;
   c) translating the mask laterally; and
   d) performing a second 2-shot process using the second set of slits while simultaneous illuminating both the first set of slits and the second set of slits.

4. The method of claim 3, wherein the mask is translated laterally without rotating the substrate relative to the mask.

5. The method of claim 3, wherein the second set of substantially parallel slits is at an approximately 90 degree angle relative to the first set of slits.

6. The method of claim 3, wherein the first set of slits comprises a first array of beamlets and a second array of beamlets, and the step of performing the first 2-shot process further comprises the steps of:
   a) irradiating the material layer through the first array of beamlets to crystallize a first set of material regions;
   b) translating the mask laterally; and
   c) irradiating the material layer through the second array of beamlets to crystallize regions of the material layer adjacent to the first set of material regions.

7. The method of claim 6, wherein the second set of slits comprises a third array of beamlets and a forth array of beamlets, and the step of performing the second 2-shot process further comprises the steps of:
   a) irradiating the material layer through the third array of beamlets to recrystallize regions of material;
   b) translating the mask laterally; and
   c) irradiating the material layer through the forth array of beamlets to crystallize regions of the material layer adjacent to the material crystallize by the third set of beamlets.

8. A method of crystallizing a thin film of material comprising the steps of:
   a) depositing a thin film of material over a substrate;
   b) irradiating regions of the material with a first array of beamlets by positioning a mask comprising the pattern of the first array of beamlets over the regions;
   c) stepping the mask in a lateral direction until a second array of beamlets is positioned at least partially overlapping the regions irradiate by the first array of beamlets;
   d) irradiating regions adjacent to the regions irradiated by the first array of beamlets;
   e) stepping the mask in the same lateral direction until a third array of beamlets is positioned at least partially overlapping the regions irradiated by the first array of beamlets and the second array of beamlets;
   f) irradiating regions of the material with the third array of beamlets;
   g) stepping the mask in the same lateral direction until a forth array of beamlets is positioned at least partially overlap regions of the material irradiated by the third array of beamlets; and
   h) irradiating regions adjacent to the regions irradiated by the third array of beamlets.

* * * * *